United States Patent
Liao

(10) Patent No.: US 9,087,814 B2
(45) Date of Patent: Jul. 21, 2015

(54) HEAT DISSIPATION MODULE

(71) Applicant: Acer Incorporated, Taipei Hsien (TW)

(72) Inventor: Wen-Neng Liao, Taipei Hsien (TW)

(73) Assignee: ACER INCORPORATED, Taipei Hsien (TW)

( * ) Notice: Subject to any disclaimer, the term of this patent is extended or adjusted under 35 U.S.C. 154(b) by 170 days.

(21) Appl. No.: 13/666,616

(22) Filed: Nov. 1, 2012

(65) Prior Publication Data

US 2013/0120937 A1 May 16, 2013

(30) Foreign Application Priority Data

Nov. 16, 2011 (TW) .............................. 100141751 A

(51) Int. Cl.
*H05K 7/20* (2006.01)
*H01L 23/427* (2006.01)
*F28D 15/02* (2006.01)

(52) U.S. Cl.
CPC .......... *H01L 23/427* (2013.01); *F28D 15/0233* (2013.01); *F28D 15/0275* (2013.01); *H01L 2924/0002* (2013.01)

(58) Field of Classification Search
USPC ........................ 361/676–678, 679.46–679.54, 361/688–722, 752, 760, 831
See application file for complete search history.

(56) References Cited

U.S. PATENT DOCUMENTS

| | | | | |
|---|---|---|---|---|
| 6,163,073 A * | 12/2000 | Patel | .............................. | 257/712 |
| 6,424,528 B1 * | 7/2002 | Chao | .............................. | 361/700 |
| 7,028,758 B2 * | 4/2006 | Sheng et al. | .............. | 165/104.21 |
| 7,165,603 B2 * | 1/2007 | Mochizuki et al. | ....... | 165/104.21 |
| 7,342,788 B2 * | 3/2008 | Nikfar | .......................... | 361/700 |
| 7,545,645 B2 * | 6/2009 | Kuan | .............................. | 361/700 |
| 7,864,532 B1 * | 1/2011 | Ehret et al. | ..................... | 361/713 |
| 8,353,333 B2 * | 1/2013 | Chen et al. | .................... | 165/80.5 |
| 2004/0050534 A1 * | 3/2004 | Malone et al. | ............... | 165/80.3 |
| 2008/0062649 A1 * | 3/2008 | Leng et al. | ..................... | 361/700 |
| 2009/0095448 A1 * | 4/2009 | Lai et al. | .................. | 165/104.33 |
| 2009/0310296 A1 * | 12/2009 | Peng et al. | ............... | 361/679.49 |

FOREIGN PATENT DOCUMENTS

| | | |
|---|---|---|
| CN | 1705112 | 12/2005 |
| TW | M361658 | 7/2009 |
| TW | M410251 | 8/2011 |

OTHER PUBLICATIONS

Taiwanese language office action dated Sep. 23, 2013.
English language translation of abstract of TW M361658 (published Jul. 21, 2009).
English language translation of abstract of TW M410251 (published Aug. 21, 2011).
Chinese language office action dated Dec. 24, 2014.
English language translation of abstract of CN 1705112 (published Dec. 7, 2005).

* cited by examiner

*Primary Examiner* — Courtney Smith
(74) *Attorney, Agent, or Firm* — McClure, Qualey & Rodack, LLP

(57) ABSTRACT

A heat dissipation module for an electronic component is provided. The heat dissipation module includes a supporting structure and a heat pipe. The supporting structure is adjacent to the heat electronic component. The heat pipe is connected to the supporting structure by soldering, and the bottom surface of the heat pipe is directly in contact with the upper surface of the electronic component.

12 Claims, 6 Drawing Sheets

HEAT DISSIPATION MODULE

CROSS REFERENCE TO RELATED APPLICATIONS

This application claims priority of Taiwan Patent Application No. 100141751, filed on Nov. 16, 2011, the entirety of which is incorporated by reference herein

BACKGROUND OF THE INVENTION

1. Field of the Invention

The invention relates to a heat dissipation module, and more particularly, to a heat dissipation module which directly contacts to an electronic element.

2. Description of the Related Art

In order to enable portable electronic devices to rapidly process a variety electronic signals, a central processing unit (CPU) and a graphic processing unit (GPU) are often installed therein. When the CPU or GPU operates at a high speed in the electronic device, its temperature is greatly increased. Thus, it is desirable to dissipate heat by using a heat dissipation module to allow the CPU or GPU and other electronic components to function within their normal operating temperature ranges, thereby assuring the quality of data management, storage and transfer operations.

The conventional heat dissipation module includes a heat-receiving portion, a heat pipe, and a heat sink. The heat receiving portion, normally with an area larger than the electronic components, is disposed upon the electronic component, and a distance is formed therebetween. The heat pipe is accommodated in the heat-receiving portion, and the heat-receiving portion is connected to the heat sink via the heat pipe. Hence, the heat generated by the electronic components is received by the heat-receiving portion and further conducted to the heat sink via the heat pipe.

However, due to structural limitations, the heat generated by the electronic components cannot be received by the heat pipe directly, which results in the heat dissipation efficiency of the conventional heat dissipation module not meeting the increasing heat removal requirements of modern heat-generating electronic components. Furthermore, with the arrangement of the heat-receiving portion, the thickness of the conventional heat dissipation module is increased, which hinders the development of thin and light-weight electronic device.

BRIEF SUMMARY OF THE INVENTION

Accordingly, one of the objectives of the present invention is to provide a heat dissipation module, wherein the heat generated by electronic components is directly received by a heat pipe so that the heat dissipation efficiency is increased. The other objective of the present invention is to decrease the thickness of the heat dissipation module so as to meet the demand of making a device using the same thinner. Still the other objective of the present invention is to reduce a number of necessary elements of the heat dissipation module, thus decreasing the weight and reducing the manufacturing cost of the heat dissipation module can be achieved by simplifying the manufacturing process.

To achieve the above objectives, a heat dissipation module for an electronic component is provided by the present invention. The heat dissipation module includes a supporting structure and a heat pipe. The supporting structure is adjacent to the heat electronic component. The heat pipe is connected to the supporting structure by soldering, and the bottom surface of the heat pipe is directly in contact with the upper surface of the electronic component. Between the two lateral surfaces of the groove, the heat pipe has a second width larger than that of or equal to the first width.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
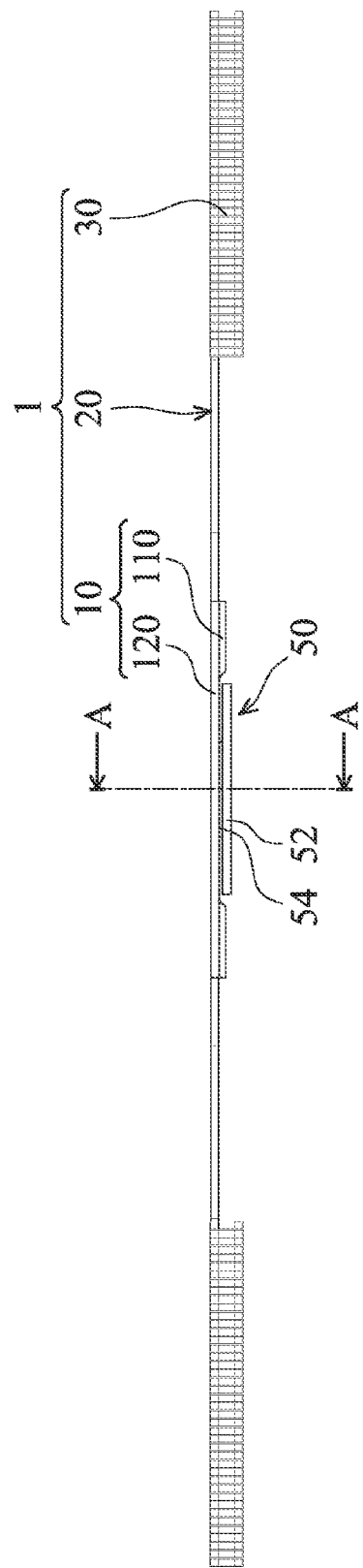
FIG. 1 depicts a side view of a heat dissipation module in accordance with a first embodiment of the invention.

The following description is of the best-contemplated mode of carrying out the invention. This description is made for the purpose of illustrating the general principles of the invention and should not be taken in a limiting sense. The scope of the invention is best determined by reference to the appended claims Please refer to FIGS. 1-3. The heat dissipation module 1 is used for an electronic component 50, to receive and dissipate heat generated from the electronic component 50. In on exemplary embodiment, the electronic component 50 includes a base 52 and a central processing unit 54, hereinafter a CPU, wherein the base 52 is used for connection to a, for example, motherboard of a computer (not shown in FIGs.), and the CPU 54 is disposed on a substantial center of the base 52.

The heat dissipation module 1 of the embodiment includes a supporting structure 10, a heat pipe 20, and a plurality of heat sinks 30. The supporting structure 10 includes two connecting portions 110 and two engaging portions 120. The two connecting portions 110 are respectively disposed at opposing sides of the base 52 of the electronic components 50, wherein both of the lateral surfaces of the two connecting portions 110 are inclined surfaces. In other words, along a direction away from the upper surface 111 of the two connecting portions 110, the distance between two connecting portions 110 increases gradually, which prevents contact between the two connecting portions 110 of the heat dissipation module 1 and the base 52 of the electronic component 50.

Figure 3:
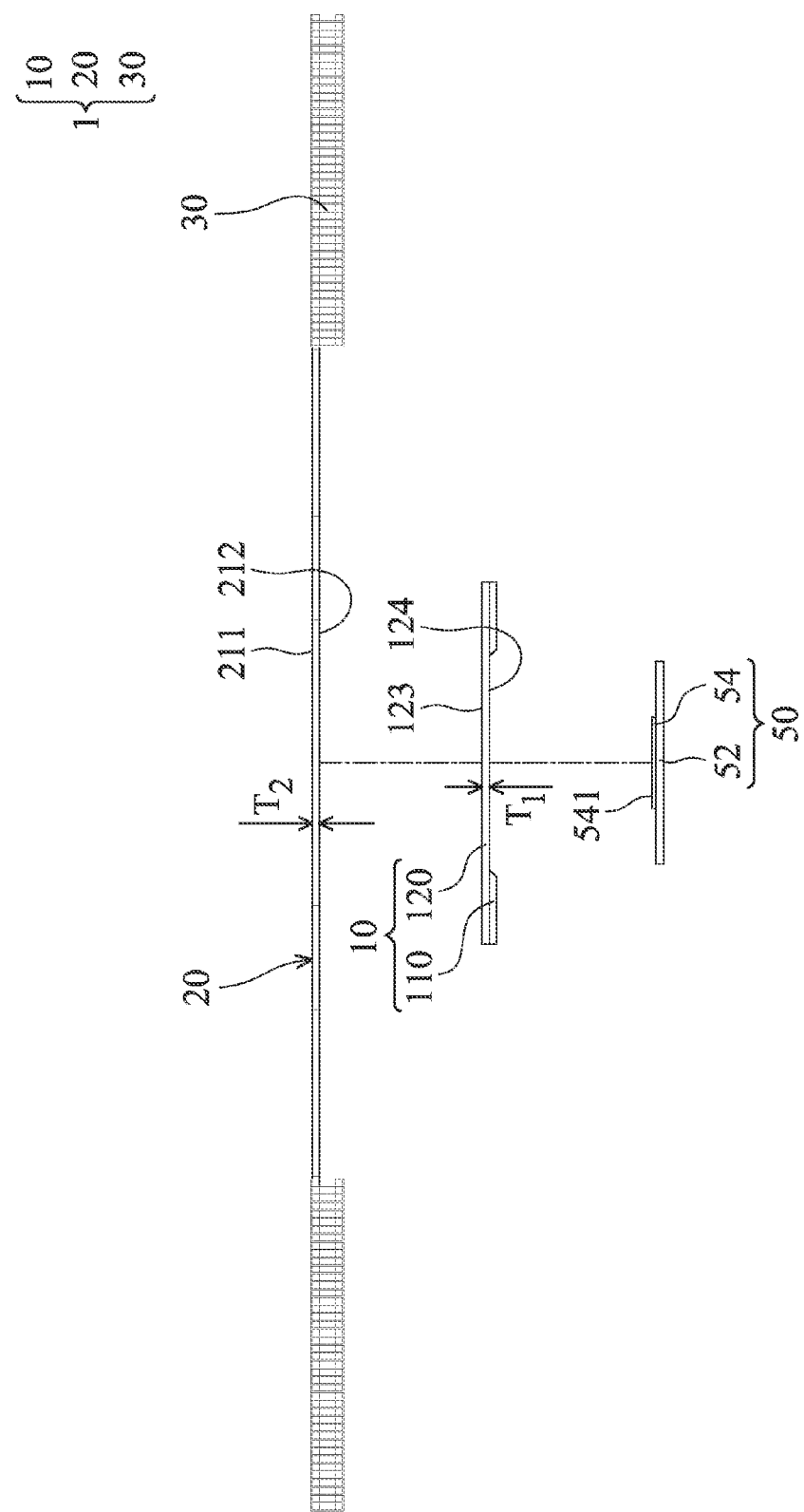
FIG. 3 is an explosive view as viewed from lateral side of the heat dissipation module in accordance with the first embodiment of the invention.

The two connecting portions 110 are connected to each other via the two engaging portions 120, wherein the two engaging portions 120 are connected to the upper surfaces 111 of the two connecting portions 110. The two engaging portions 120 are respectively with a first thickness $T_1$ (FIG. 3). The two lateral surfaces 121 and 122 of the two engaging portions 120 face each other, and a first width $D_1$ is formed between the two lateral surfaces 121 and 122, thereby a groove 125 is defined between the two lateral surfaces 121 and 122. In general, a through hole, surrounded by the two connecting portions 110 and the two engaging portions 120, is formed at a substantial center of the supporting structure 10, wherein the electronic components 50 correspond to the through hole and is surrounded by the two connecting portions 110 and the two engaging portions 120.

In one exemplary embodiment, the two connecting portions 110 and the two engaging portions 120 of the supporting structure 10 are formed integrally. The supporting structure 10 can be comprised of aluminum, aluminum magnesium alloy or cast iron. Preferably, the supporting structure 10 is comprised of aluminum to achieve the objective of making a light weight heat dissipation module 1.

The heat pipe 20 is partially disposed in the groove 125 of the supporting structure 10, wherein the portion of the heat pipe 20 which is disposed in the groove 125 is with a thickness $T_2$. The heat pipe 20 extends from the supporting structure 10 along two directions away from the supporting structure 10, and the heat sinks 30 are disposed on the two distal ends of the heat pipe 20 to increase the heat dissipating area. In one exemplary embodiment, two 4-inch fans (not shown in FIGs.) relatively to the heat sink 30 are disposed on the surface of the heat sink 30 to increase the heat dissipation efficiency.

Figure 2:
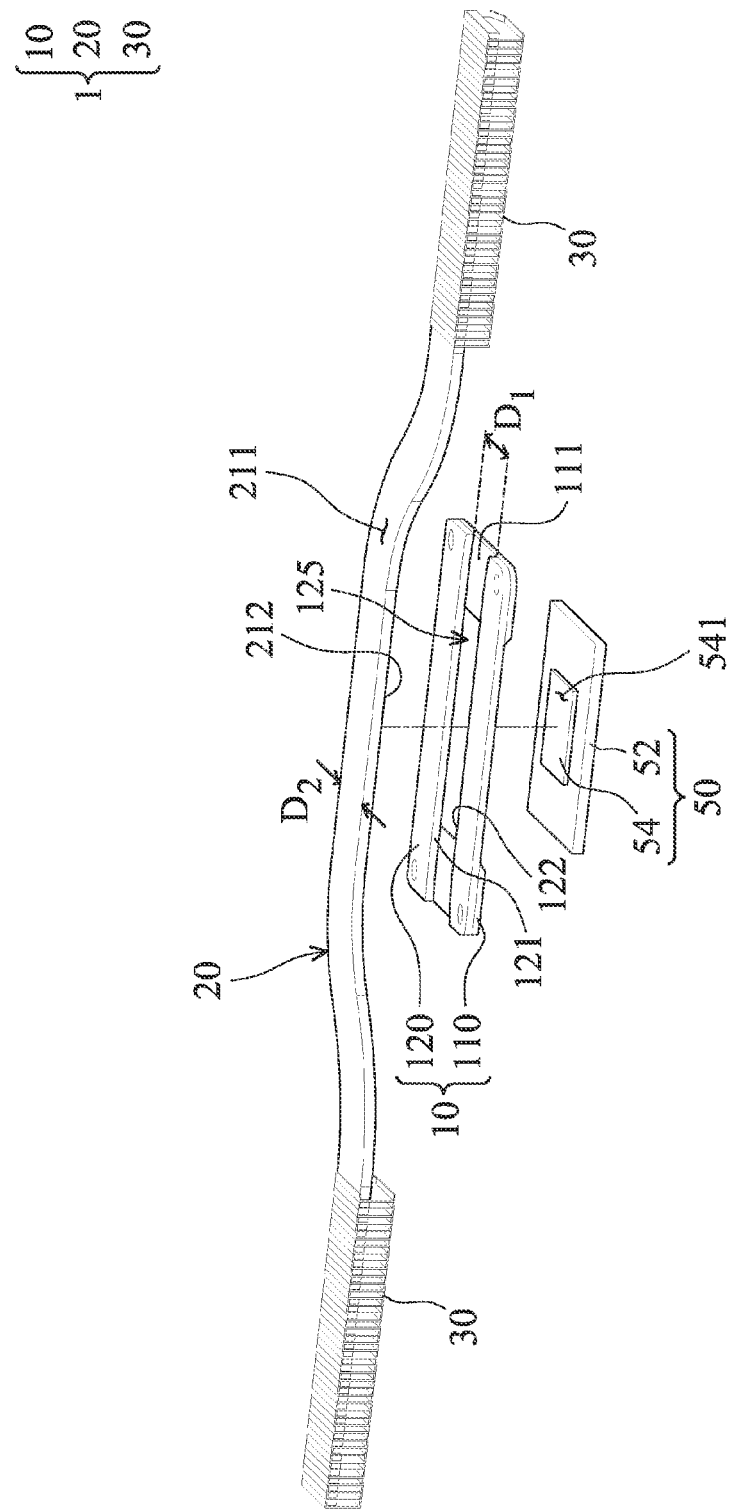
FIG. 2 is an explosive view of the heat dissipation module in accordance with the first embodiment of the invention.
Figure 4:
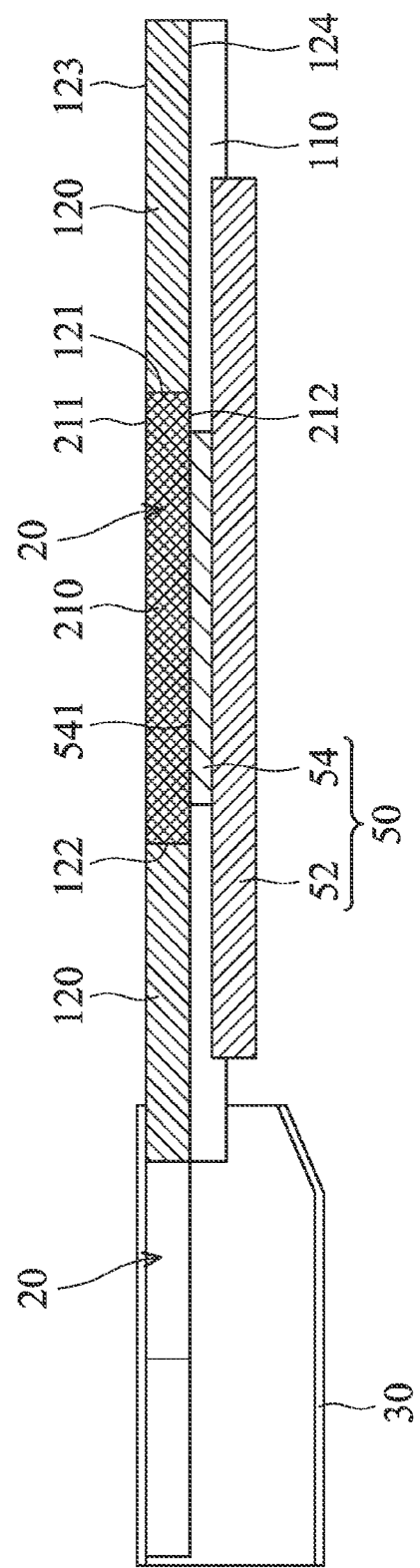
FIG. 4 is a cross-sectional view taken along line A-A of FIG. 1 in accordance with the first embodiment of the invention.
Figure 5:
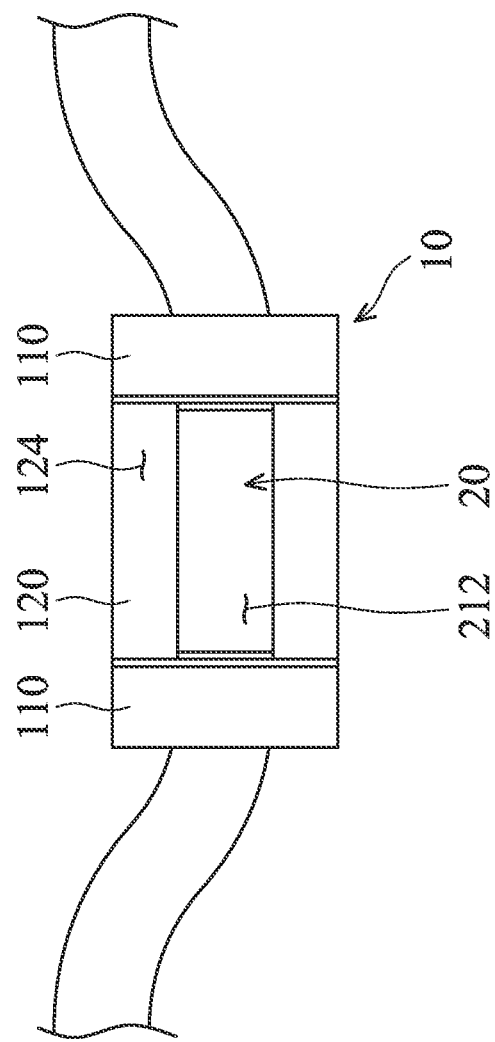
FIG. 5 is a partial bottom view of the heat dissipation module in accordance with the first embodiment of the invention.

Please refer to FIGS. 2, 4, and 5. Details of the assembly process of the heat dissipation module 1 and a method of connecting the heat dissipation module 1 to the electronic component 50 are described below. In one exemplary embodiment, the heat pipe 20 is soldered on the upper surfaces 111 of the two connecting portions 110 via a solder paste (not shown in FIGs.), but the soldering material is not limited thereto. Next, by a rolling process, a roller (not shown in FIGs.) is provided to press the upper surface 211 of the heat pipe 20 resulting in an extension of the heat pipe 20 toward the two corresponding lateral surfaces 121 and 122 of the two engaging portions 120. After the roller passes through the heat pipe 20 many times, the heat pipe 20 is firmly engaged with the two corresponding lateral surfaces 121 and 122 of the two engaging portions 120. Specifically, after the rolling process, the heat pipe 20 between the two corresponding lateral surfaces 121 and 122 is with a second width $D_2$, wherein the second width $D_2$ is slightly larger than or equals to the first width $D_1$. Thus, after the heat pipe 20 is disposed in the groove 125, the heat pipe 20 is received in tight fit relation on the supporting structure 10.

It is noted that, after the heat pipe 20 is disposed on the supporting structure 10, a partial bottom surface 212 among the two connecting portions 110 and the two engaging portions 120 of the heat pipe 20 is exposed on the outside, as shown in FIG. 5. Therefore, when the electronic component 50 is disposed at the substantial center of the two connecting portions 110, the bottom surface 212 of the heat pipe 20 is directly in contact with the upper surface 541 of the CPU 54. Hence, the heat generated from the CPU 54 is received by the heat pipe 20 directly and further conducted to the heat sink 30 disposed at the distal ends of the heat pipe 20 rapidly. On the other hand, because the corresponding lateral surfaces of the two connecting portions 110 of the supporting structure 10 are two inclined surfaces, when the electronic component 50 is disposed at the substantial center of the two connecting portions 110, the base 52 is not to be contacted by the two connecting portions 110.

After the heat pipe 20 is disposed on the supporting structure 10, the bottom surface 124 of the engaging portion 120 and the bottom surface 212 of the heat pipe 20 are preferably located on one flat surface, but it is not limited thereto. The bottom surface 124 of the engaging portion 120 may also be higher than the bottom surface 212 of the heat pipe 20. In this condition, the CPU 54 is accommodated in the two engaging portions 120. That is, the CPU 54 is accommodated within the groove 125 to further reduce the thickness of the heat dissipation module 1 after combining the electronic component 50. Additionally, the heat generated from the CPU 54 may be partially conducted to the heat pipe 20 via the two connecting portions 110 and the two engaging portions 120. Furthermore, the upper surface 211 of the heat pipe 20 and the upper surfaces 123 of the two engaging portions 120 are preferably located on one flat surface. In general, the thickness $T_1$ of the two engaging portions 120 is larger than or equals to the thickness $T_2$ of the heat pipe 20.

During the assembly process of the heat pipe 20 and the electronic components 50, a gas gap may be formed between the heat pipe 20 and the electronic components 50 resulting in a decrease of heat dissipation efficiency therebetween. To fill the gap, a thermal paste can be applied to be between the heat pipe 20 and the electronic components 50; thus, the heat dissipation efficiency can be further increased. On the other hand, due to insufficient mechanical strength of the heat pipe 20 and gravity effects, the heat pipe 20 cannot be maintained with a straight structure, which prevents the CPU 54 from being firmly contacted to the heat pipe 20 and affects heat dissipation efficiency. To solve this problem, the present invention provides a method as below.

Figure 6:
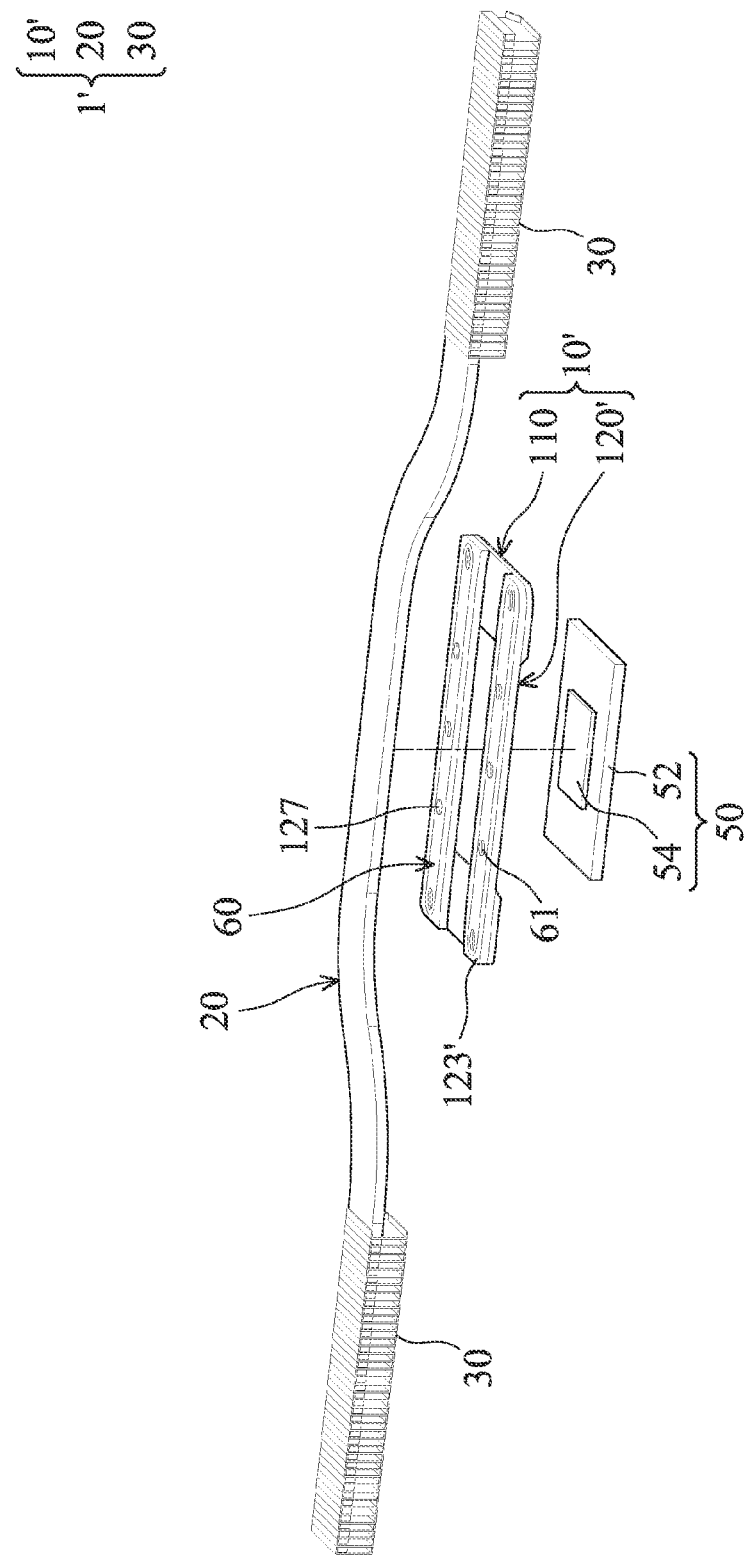
FIG. 6 is an explosive view of a heat dissipation module in accordance with a second embodiment of the invention.

Please refer to FIG. 6. FIG. 6 shows a heat dissipation module 1' in accordance with a second embodiment of the invention, wherein elements substantially similar to that of the first embodiment are designated with like reference numbers and explanation that has been given already will be omitted in the following description. Compared with the heat dissipation module 1 (FIG. 1), the heat dissipation module 1' further includes two flexure strips 60, wherein each of the flexure strips 60 includes a plurality of riveting holes 61 separately disposed thereon. The supporting structure 10' further includes a plurality of riveting points 127 corresponding to the riveting holes 61 disposed on the upper surface 123' of the engaging portions 120'. The riveting points 127 are received in the riveting holes 61 so that the flexure strips 60 are connected to the upper surfaces 123' of the engaging portions 120'. Due to the ductility of the flexure strips 60, each of the flexure strips 60 provides a thrust force toward the electronic component 50 to allow the heat pipes 20 to contact the CPU 54 more reliably. Specifically, because the heat pipe 20 is firmly engaged between the two engaging portions 120', while the flexure strips 60 provide thrust force to the two engaging portions 120', the thrust force is passed to the heat pipe 20 to keep it straight; thus, the heat pipe 20 and the CPU 54 are contacted reliably and the heat conducting rate is increased.

By direct contact between the heat pipe and the electronic component, heat generated from the electronic component can be dissipated by the heat dissipation module in an efficient way, and the thickness of the heat dissipation module can be reduced (in one exemplary embodiment, the thickness of a heat dissipation module of the present invention is 1.3 mm). Therefore, the objective of making a device using the same thinner can be achieved. Furthermore, thanks to the innovative mechanical feature of the supporting structure, the heat pipe can be disposed on the electronic component firmly and reliably effectuating an increase of heat dissipating efficiency.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation module for an electronic component, comprising:
   a supporting structure, adjacent to the electronic component; and
   a heat pipe, connected to the supporting structure by soldering, wherein a bottom surface of the heat pipe is directly in contact with an upper surface of the electronic component and the heat pipe is connected to the supporting structure via the bottom surface, wherein the supporting structure comprises:
   two connecting portions, disposed on the two sides of the electronic component, and the heat pipe is disposed on upper surfaces of the two connecting portions; and
   an engaging portion, wherein the two connecting portions are connected to each other via the engaging portion, and the heat pipe is engaged in the engaging portion,
   wherein a bottom surface of the engaging portion and the bottom surface of the heat pipe are located on one flat surface, or the bottom surface of the engaging portion is higher than the bottom surface of the heat pipe.

2. The heat dissipation module as claimed in claim 1, wherein the number of engaging portions is two, respectively disposed on two opposing sides of the heat pipe, wherein a first width is formed between the two engaging portions and the heat pipe has a second width larger than the first width.

3. The heat dissipation module as claimed in claim 1, further comprising a flexure strip disposed on the engaging portion to provide a thrust force toward the electronic component.

4. The heat dissipation module as claimed in claim 1, wherein along a direction away from the heat pipe, the distance between two connecting portions increases gradually.

5. The heat dissipation module as claimed in claim 1, further comprising a plurality of heat sinks, wherein the heat pipe is extended from the supporting structure, and the heat sinks are disposed on the distal end of the heat pipe.

6. A heat dissipation module for an electronic component, comprising:
   a supporting structure, comprising a groove formed on an upper surface of the supporting structure, wherein a first width is formed between two lateral surfaces of the groove; and
   a heat pipe, disposed in the groove of the supporting structure, and a bottom surface of the heat pipe is directly in contact with the upper surface of the electronic component,
   wherein between the two lateral surfaces of the groove, the heat pipe has a second width larger than that of or equal to the first width,
   wherein at least one end of the groove is formed on a lateral side of the supporting structure, and the heat pipe extends to the outside of the supporting structure via the end of the groove.

7. The heat dissipation module as claimed in claim 6, wherein the supporting structure comprises:
   two connecting portions, disposed on two sides of the electronic component; and
   two engaging portions, connected between the two connecting portions, wherein the groove is formed between the two engaging portions.

8. The heat dissipation module as claimed in claim 7, wherein the heat pipe is connected to the two connecting portions of the supporting structure by soldering.

9. The heat dissipation module as claimed in claim 7, wherein a bottom surface of the engaging portion and the bottom surface of the heat pipe are located on one flat surface or the bottom surface of the engaging portion is higher than the bottom surface of the heat pipe.

10. The heat dissipation module as claimed in claim 7, wherein along a direction away from the heat pipe, the distance between two connecting portions increases gradually.

11. The heat dissipation module as claimed in claim 7, further comprising a flexure strip disposed on the engaging portion to provide a thrust force toward the electronic component.

12. The heat dissipation module as claimed in claim 6, further comprising a plurality of heat sinks, wherein the heat pipe is extended from the supporting structure, and the heat sinks are disposed on the distal end of the heat pipe.

* * * * *